United States Patent
Shih

[19]

[11] Patent Number: 5,976,902
[45] Date of Patent: Nov. 2, 1999

[54] METHOD OF FABRICATING A FULLY SELF-ALIGNED TFT-LCD

[75] Inventor: Hsueh-Feng Shih, Taipei, Taiwan

[73] Assignee: Industrial Technology Research Institute, Hsinchu Hsien, Taiwan

[21] Appl. No.: 09/127,847

[22] Filed: Aug. 3, 1998

[51] Int. Cl.⁶ .......................... H01L 21/336; H01L 21/84
[52] U.S. Cl. .............................. 438/30; 438/158; 257/59; 257/72
[58] Field of Search .................... 438/30, 158, FOR 155, 438/FOR 136, FOR 200, FOR 211; 257/59, 72

[56] References Cited

U.S. PATENT DOCUMENTS

| | | | |
|---|---|---|---|
| 5,032,531 | 7/1991 | Tsutsui et al. | 438/30 |
| 5,166,086 | 11/1992 | Takeda et al. | 438/30 |
| 5,441,905 | 8/1995 | Wu | 438/158 |
| 5,580,796 | 12/1996 | Takizawa et al. | 438/30 |

*Primary Examiner*—Mary Wilczewski
*Attorney, Agent, or Firm*—McDermott, Will & Emery

[57] ABSTRACT

An ITO layer and a first metal layer is patterned on a glass substrate. A first silicon nitride layer, a silicon layer and a second silicon nitride layer are formed on the substrate. A back-side exposure is introduced using the gate electrodes as a mask. The second silicon nitride layer that is not covered by a positive photoresist is etched. A heavily doped silicon layer is formed over the substrate. A negative photoresist is formed over the heavily doped silicon layer. Then, a further back-side exposure is employed. The heavily doped silicon layer over the etched second silicon nitride layer is removed. Via holes are created to expose a portion of the first metal layer. A second metal layer and a third metal layer are respectively formed. Next, a thermal annealing is performed for forming silicide. Subsequently, a third metal layer and the second metal layer are patterned. Then, the island pattern is defined. Subsequently, a passivation layer formed of silicon nitride layer is deposited on the island pattern.

16 Claims, 7 Drawing Sheets

METHOD OF FABRICATING A FULLY SELF-ALIGNED TFT-LCD

FIELD OF THE INVENTION

The present invention relates to a method of making thin film transistors, and more specifically, to a method of forming a thin film transistor-liquid crystal displays.

BACKGROUND OF THE INVENTION

Thin film transistor-liquid crystal display (TFT-LCD) is known as the display required for the high pixel density and quality. In general, the TFT-LCD includes a bottom plate formed with thin film transistors and pixel electrodes and a top plate formed with color filters. The liquid crystal is filled between the top plate and the bottom plate. In each unit pixel, a capacitor and a further capacitor are provided which are formed by virtue of the TFT serving as the switching element of the unit pixel. In the operation, a gate signal voltage is applied to the TFT that is the switching element of each unit pixel. The TFT receives the gate signal voltage, it is turn on so that data voltage carrying image information can be applied to the corresponding pixel electrode and the liquid crystal via the TFT. When the data voltage is applied to the TFT, the arrangement of the liquid crystal moleculers is change, thereby changing the optical properties and displaying the image.

A conventional method for forming a TFT will be described in conjunction with FIGURES 1A–1L.

In accordance with the prior method, an opaque metal layer such as Al, Ta, or Cr is formed on a substrate 2. The metal layer is patterned to serve as a gate electrode 4 and a metal interconnection (MI) 3. A stacked layer consisted of a first silicon nitride layer 6, an amorphous silicon layer 8 and a second silicon nitride layer 10 are formed on the substrate 2. A positive photoresist 12 is patterned on the second silicon nitride layer 10. Next, an exposure indicated by 16 is performed from the back side of the substrate 2 using the gate electrodes as a mask. Then, the portion 10a covered by the gate electrode is left after the steps. The portion on the MI 3 can be removed by masking and etching procedures.

Subsequently, a doping area 18 is performed by using implanting ions into the amorphous silicon layer 8. Next, turning to FIG. 1E to FIG. 1F, a metal layer 20 is formed on the doping area 18. An annealing step is used to react the silicon layer 10 and the metal layer to generate metal silicide layer 22 on the amorphous silicon layer 8. A second photoresist 24 is patterned over the gate electrode 4 using photo-lithography method, as shown in FIG. 1G. Then, the source and drain regions are defined by etching the silicide layer 22 and the amorphous silicon layer 8 exposed by the second photoresist 24. The result is shown in FIG. 1H. The source and drain regions are separated by the structure 10a. The second photoresist 24 is removed.

Referring to FIG. 1I–1L, an indium tin oxide (ITO) 26 is patterned on the first silicon nitride layer 6 adjacent to the source and drain regions. The first silicon nitride layer 6 over the MI 3 is removed, then a metal connection 28 are formed over the MI 3, the source and drain regions 22. Typically, the metal connection 28 is formed of Cr/Al. Finally, a passivation layer 30 is formed to cover the metal connection 28 and the source and drain regions 22.

The conventional method uses the ion implantation to form the source and drain silicide 22 and also act as n+ source. After the step, various steps, such as ITO pattern, contact etching and source and drain pattern are need for forming the TFT. However, these steps that involves the oxygen plasma or BOE (buffer oxide etching) etching will increase the resistance of the silicide 22, thereby reducing the performance of the TFT device. Further, the method needs implanter for doping and the method mentioned above needs at least seven masking processes. What is required is a new method for forming the TFT device.

SUMMARY OF THE INVENTION

An ITO layer and a first metal layer is patterned on a glass substrate. A stacked layer consisted of a first silicon nitride layer, an amorphous silicon and a second silicon nitride layer are formed on the substrate. A positive photoresist is formed on the second silicon nitride layer. A back-side exposure is introduced using the gate electrodes as a mask. The exposed portion of the positive photoresist is removed. Next, the second silicon nitride layer that is not covered by the positive photoresist will be etched by using buffer hydrofluoric acid solution or dry etching containing $SF_6$ and $O_2$. Then, the portion covered by the positive photoresist is remained on the amorphous layer after the procedure. Then, the photoresist is stripped. An N type heavily doped amorphous silicon layer is conformally formed on the above resulting structure. A negative photoresist is formed over the N type heavily doped amorphous silicon layer. Then, a further back-side exposure is employed by using the gate electrodes as a mask. The N type heavily doped amorphous silicon layer over the etched second silicon nitride layer will be removed. Via holes are created to expose a portion of the first metal layer. A second metal layer and a third metal layer are respectively formed. Next, a thermal annealing is performed at a temperature about 200 to 300 degrees centigrade in an ambient containing air or $N_2$ for about 30 to 90 minutes, thereby forming silicide.

Subsequently, a third metal layer is patterned by using a positive photoresist pattern. The exposed portion of the positive photoresist is removed. Then the second metal layer are etched using the etched third metal layer as a mask. A photoresist pattern is patterned to define the island pattern. Thereafter, the photoresist pattern is removed. Subsequently, a passivation layer formed of silicon nitride layer is deposited on the island pattern.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1A:
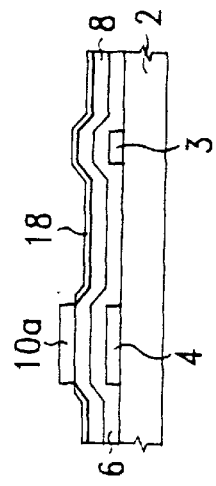
FIGS. 1A–1L are cross sectional views of a substrate illustrating the steps of forming TFT in accordance with the prior art.
Figure 1D:
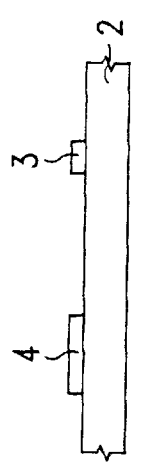
Figure 1B:
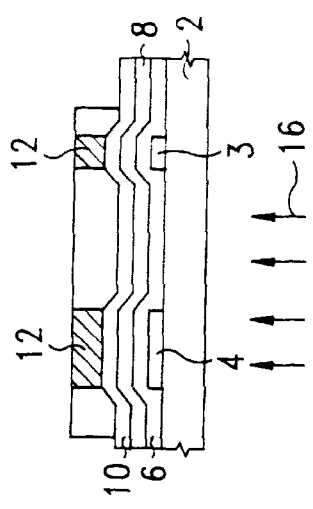
Figure 1E:
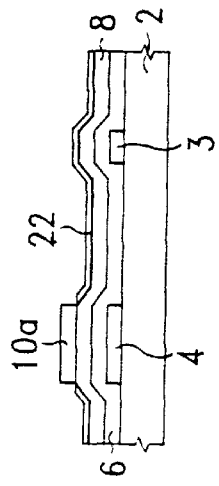
Figure 1C:
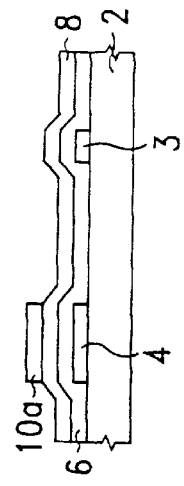
Figure 1F:
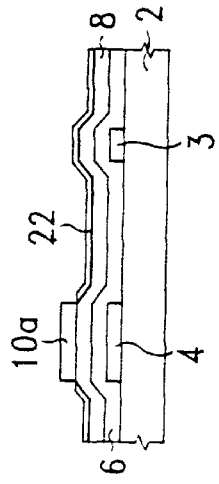
Figure 1G:
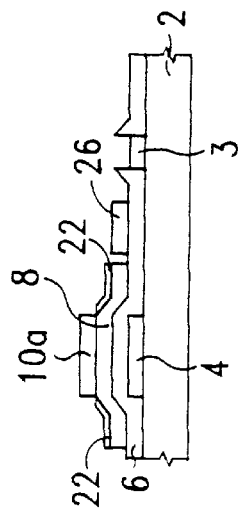
Figure 1H:
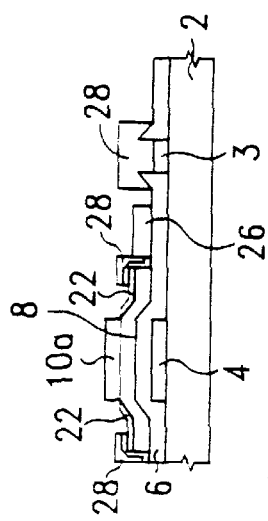
Figure 1I:
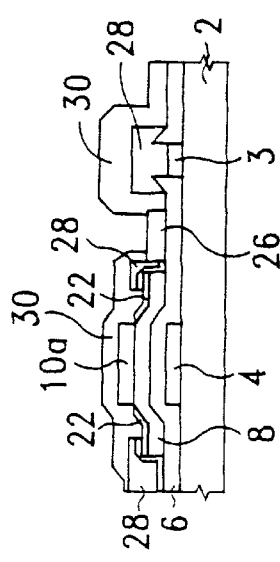
Figure 1J:
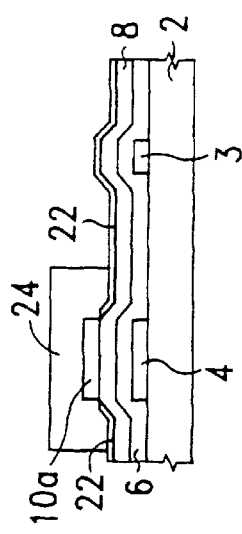
Figure 1K:
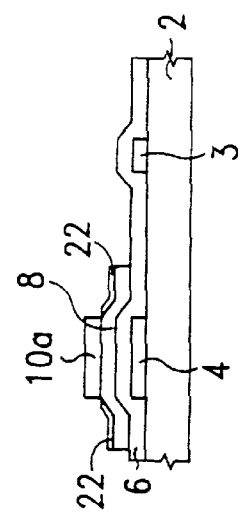
Figure 1L:
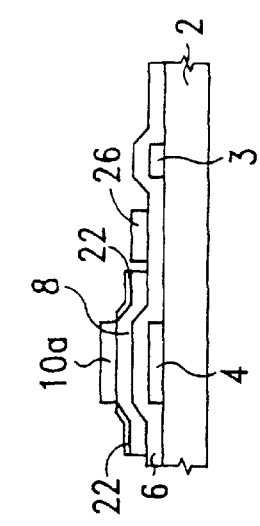
Figure 2:
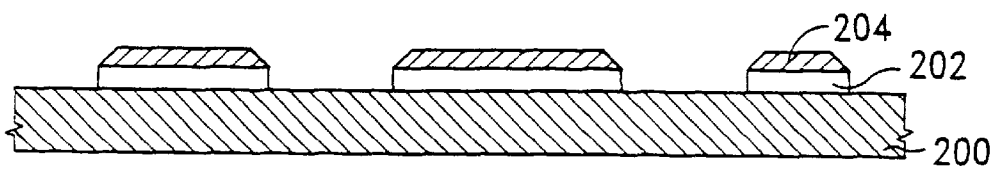
FIG. 2 is a cross sectional view of a TFT illustrating the step of forming gate pattern in accordance with the present invention.

A method is disclosed to form a TFT-LCD. The present invention needs only five masking process compared to the aforesaid conventional method. Back-side exposure technique is used to eliminate the misalignment induced by the photolithography process. Doped amorphous silicon is introduced to take the place of the implantation for source and drain doping for preventing the silicide from damage and making cost down. As will be seen below, this technique can be used for the formation of a TFT device. Referring to FIG. 2, in the preferred embodiment, a glass substrate 200 or the like is used as an insulating transparent substrate. An indium tin oxide (ITO) layer 202 is sputtered on the glass substrate 200. In a preferred embodiment, the substrate is chosen from the Corning glass such as 7059 or 1737 type. In one embodiment, the ITO layer 202 is then annealed at a temperature of about 250 degrees centigrade. The thickness of the ITO layer 202 is approximately 500–2000 angstroms.

Subsequently, still referring to FIG. 2, a first metal layer 204 for the gate electrode is formed by sputting. The first metal layer 204 can be chosen from the group of chromium (Cr), tungsten (W), titanium (Ti), tantalum (Ta) or molybdenum (Mo). As shown in FIG. 2. the first metal layer 204 is patterned on the ITO layer 202 followed by patterning the ITO layer 202 using the patterned gate electrodes 204 as a mask. The thickness of the first metal layer 204 is approximately 500–2000 angstroms.

Figure 3:
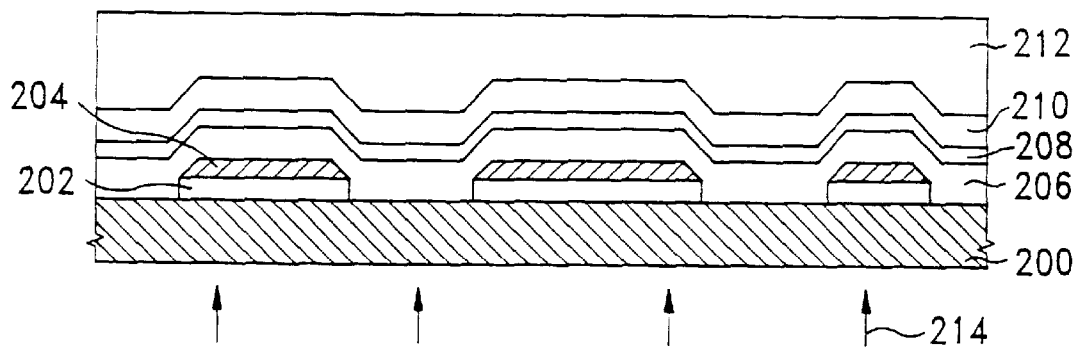
FIG. 3 is a cross sectional view of a TFT illustrating the steps of forming a stacked layer and a positive photoresist on the substrate in accordance with the present invention.
Figure 4:
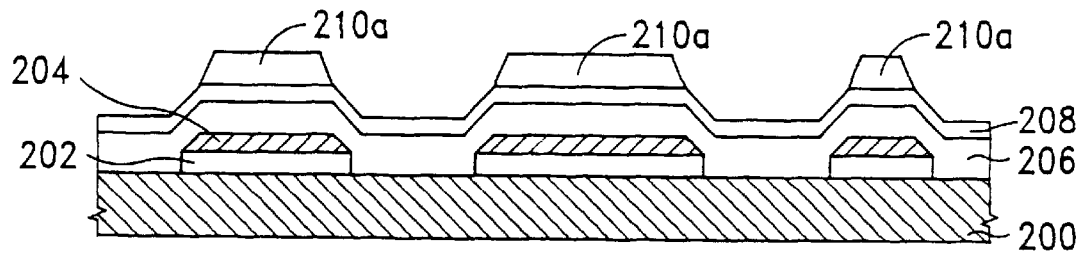
FIG. 4 is a cross sectional view of a TFT illustrating the result after a first back-side exposure in accordance with the present invention.

Turning next to FIG. 3, a stacked layer consisted of a first silicon nitride layer 206, a amorphous silicon 208 and a second silicon nitride layer 210 are sequentially formed on the substrate 200. In a case, the first silicon nitride layer 206 is formed of about 2000 to 4000 angstroms as a gate insulation, the amorphous silicon layer 208 of about 100 to 500 angstroms. The second silicon nitride layer 210 ranges from about 500 to 3000 angstroms as a channel passivation layer, in this order, using CVD method. A positive photoresist 212 is formed on the second silicon nitride layer 210. A back-side exposure indicated by 214 is introduced using the gate electrodes 204 as a mask. The exposed portion of the positive photoresist 212 is removed. Next, the second silicon nitride layer 210 that is not covered by the positive photoresist 212 will be etched by using buffer hydrofluoric acid solution or dry etching containing $SF_6$ and $O_2$. Then, the portion 210a covered by the positive photoresist 212 is remained on the amorphous layer 204 after the procedure. Then, the photoresist 212 is stripped by conventional way, as shown in FIG. 4.

Figure 5:
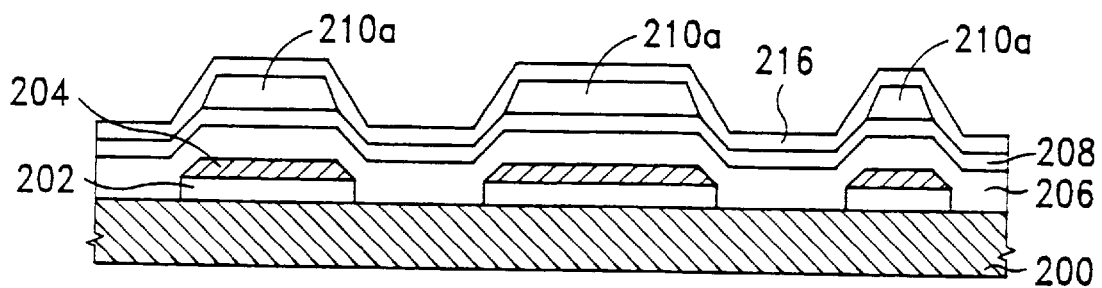
FIG. 5 is a cross sectional view of a TFT illustrating the step of forming an N type heavily doped amorphous silicon layer in accordance with the present invention.
Figure 6:
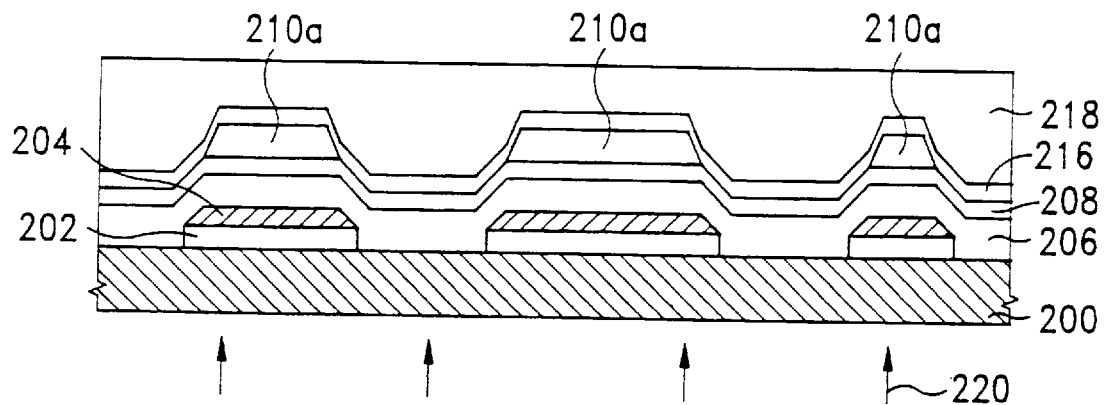
FIG. 6 is a cross sectional view of a TFT illustrating the step of performing a negative photoresist and a second back-side exposure in accordance with the present invention.
Figure 7:
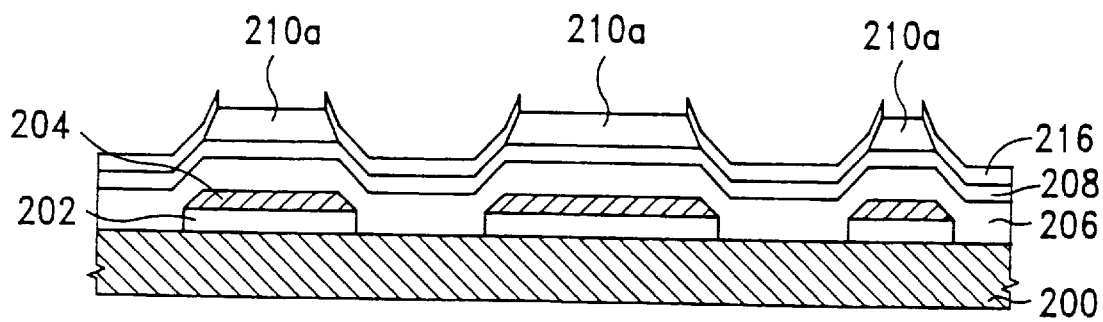
FIG. 7 is a cross sectional view of a TFT illustrating the step of etching the N type heavily doped amorphous silicon layer in accordance with the present invention.

Referring to FIG. 5, a heavily doped amorphous silicon layer 216 is conformally formed on the above resulting structure. The species of the dopant include n conductive type dopant such as phosphorus or arsenic. A negative photoresist 218 is formed over the N type heavily doped amorphous silicon layer 216, as shown in FIG. 6. Preferably, the N type heavily doped amorphous silicon layer 216 is formed to have a thickness less than 1000 angstroms. Then, a further back-side exposure indicated by 220 is employed by using the gate electrodes 204 as a mask. The exposed portion of the negative photoresist 218 will be left after develop. Then, the use of the residual negative photoresist 218 as an etching mask, the N type heavily doped amorphous silicon layer 216 over the etched second silicon nitride layer 210a will be removed as well known in the art of photolithography. FIG. 7 shows the scheme after the step. The top of the second silicon nitride layer 210a is exposed by etching the N type heavily doped amorphous silicon layer 216.

Figure 8:
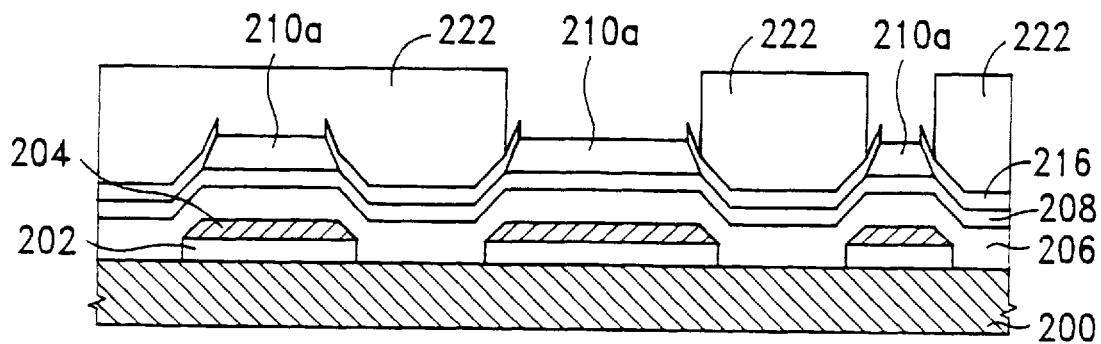
FIG. 8 is a cross sectional view of a TFT illustrating the step of forming a positive photoresist in accordance with the present invention.
Figure 9:
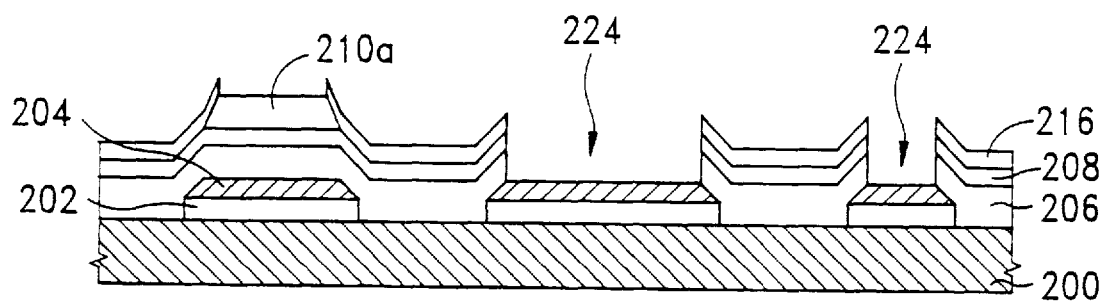
FIG. 9 is a cross sectional view of a TFT illustrating the step of forming via holes in accordance with the present invention.
Figure 10:
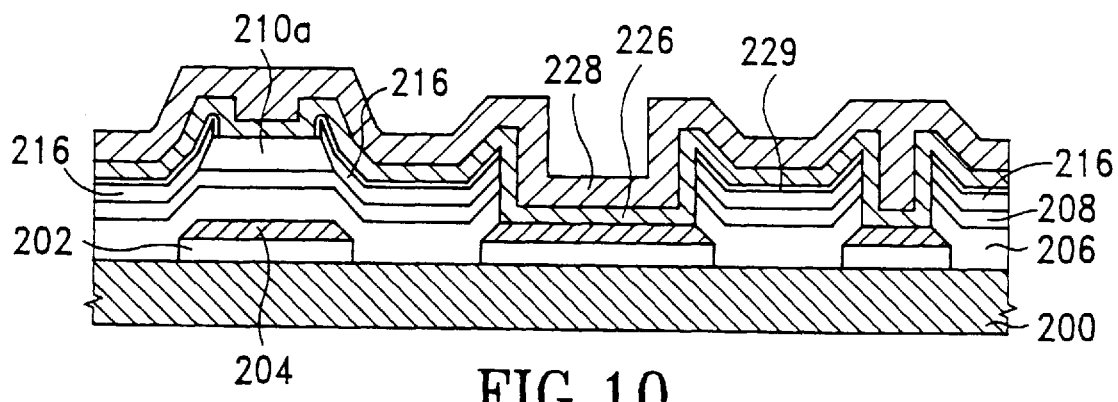
FIG. 10 is a cross sectional view of a TFT illustrating the steps of forming a second metal layer and third metal layer in accordance with the present invention.

As shown in FIGS. 8 to 9, via holes 224 are created to expose a portion of the metal layer 204. In order to achieve this, the via holes 224 can be formed by etching the stacked layer 206, 208 and 210a by using a positive photoresist pattern 222 as an etching mask. Turning to FIG. 10, a second metal layer 226 consisting of Cr or Mo and a third metal layer 228 consisting of Al or Al—Nd are respectively formed on the N type heavily doped amorphous silicon layer 216, second silicon nitride 210a, and filled into the via holes 224 on the exposed first metal layer 204. The metal layers 226 and 228 are used for source and drain conductive layer.

Next, a thermal annealing is performed at a temperature about 200 to 300 degrees centigrade in an ambient containing air or $N_2$ for about 30 to 90 minutes, thereby forming silicide 229 on the interface between the N type heavily doped amorphous silicon layer 216 and the metal layer 226.

Figure 11:
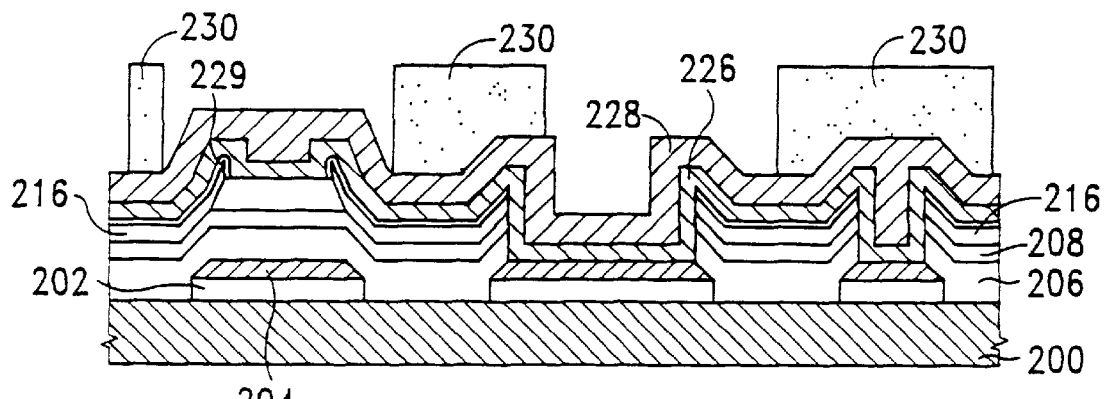
FIG. 11 is a cross sectional view of a TFT illustrating the step of forming a further positive photoresist in accordance with the present invention.
Figure 12:
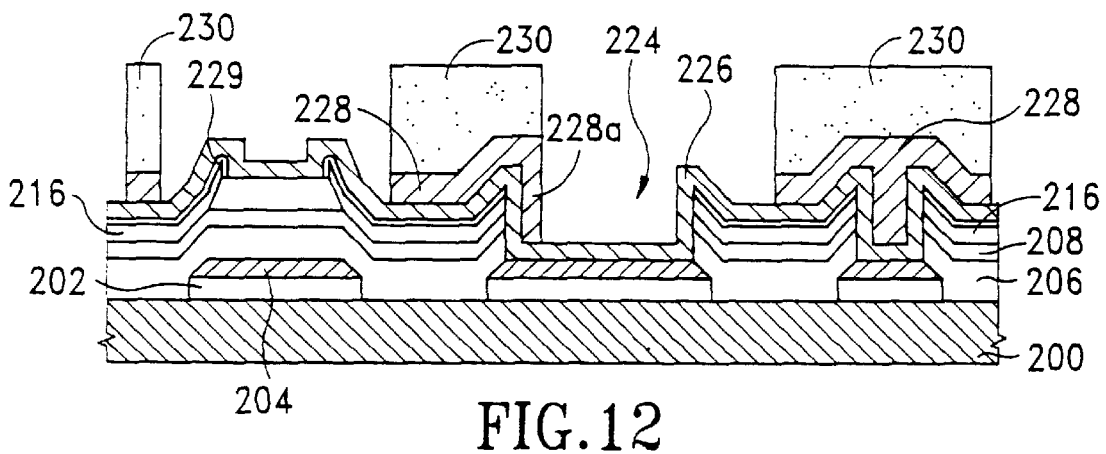
FIG. 12 is a cross sectional view of a TFT illustrating the step of etching the third metal layer in accordance with the present invention.
Figure 13:
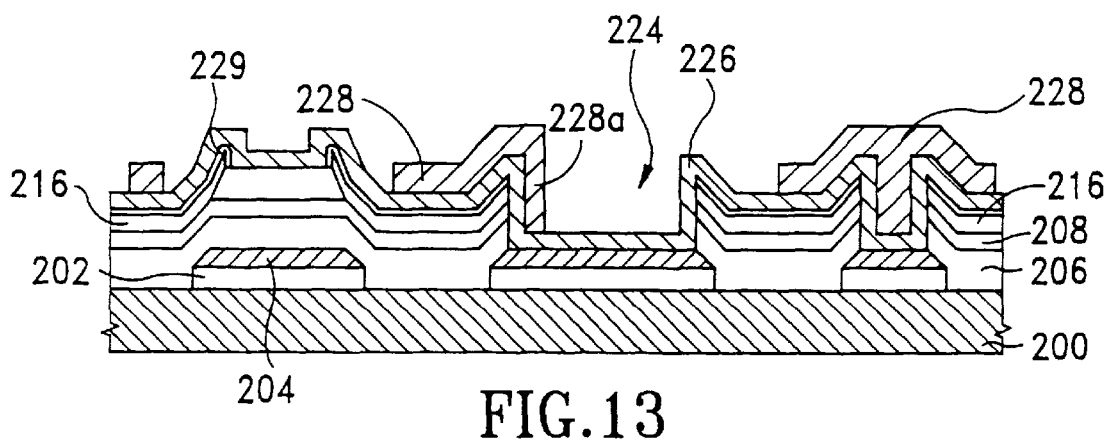
FIG. 13 is a cross sectional view of a TFT illustrating the result after the etching of the third metal layer in accordance with the present invention.

Subsequently, a positive photoresist pattern 230 is patterned on the metal layer 228, as shown in FIGS. 11–12. The third metal layer 228 is etched by using the positive photoresist pattern 230 as an etching mask to define the source and drain metal, as can be seen in the drawing, a portion of the third metal layer 228a remains in the via hole 224 for connection. Thereafter, the photoresist pattern 230 is stripped, as shown in FIG. 13.

Figure 14:
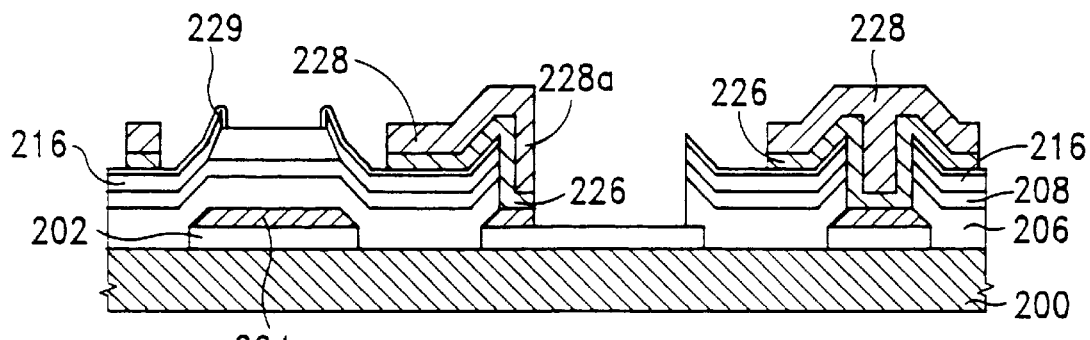
FIG. 14 is a cross sectional view of a TFT illustrating the step of etching the second metal layer in accordance with the present invention.
Figure 15:
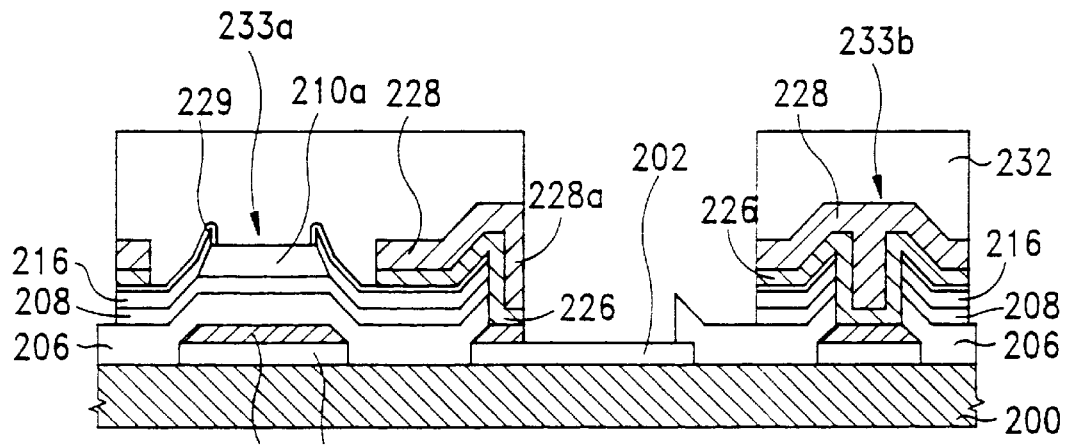
FIG. 15 is a cross sectional view of a TFT illustrating the step of patterning island pattern in accordance with the present invention.
Figure 16:
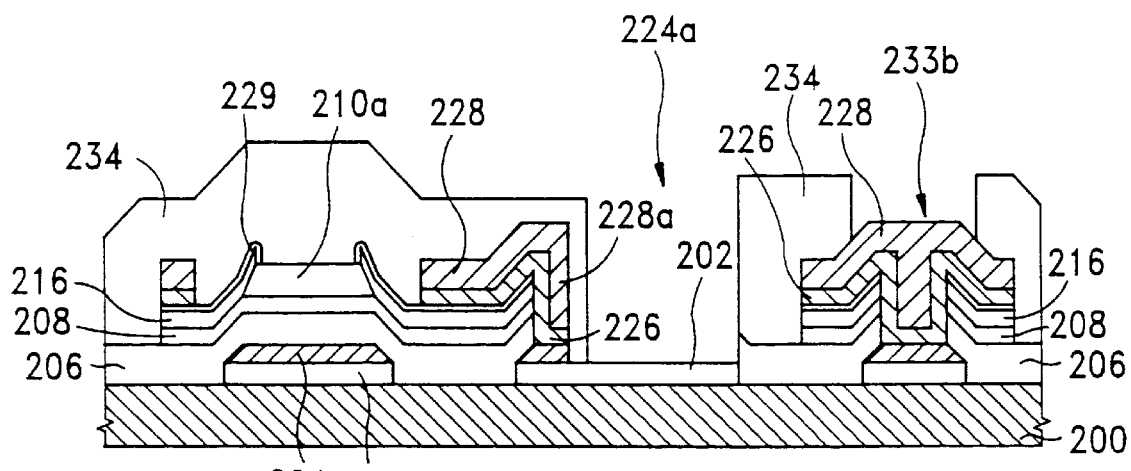
FIG. 16 is a cross sectional view of a TFT illustrating the step of forming a passivation layer in accordance with the present invention.

As shown in FIG. 14, the second metal layer 226 are then etched using the etched third metal layer 228 as a mask to form the source and drain metal pattern. The first metal layer in the via hole 224 is also removed. Turning to FIG. 15, next step is to define an island pattern. A photoresist pattern 232 is patterned to define the island pattern. Subsequently, an etching is performed to etch the silicide 229, N type heavily doped amorphous silicon layer 216, and amorphous silicon layer 208 that is not covered by the photoresist pattern 232, thereby forming the island pattern 233a and an interconnection 233b. Thereafter, the photoresist pattern 232 is removed by conventional manner. Referring to FIG. 16, subsequently, a passivation layer 234 formed of silicon nitride layer is deposited on the island pattern. Preferably, the thickness of the silicon nitride layer is about 3000 to 7000 angstroms. Finally, the passivation layer 234 is etched to expose the interconnection 233b and recreate the via hole 244a in the passivation layer 234 to expose the ITO 202.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method of forming a thin film transistor (TFT) on a glass substrate, said method comprising:

forming an indium tin oxide (ITO) on said glass substrate;

forming a first metal layer on said ITO layer;

patterning said first metal layer, said ITO layer to form a gate electrode of said TFT;

forming a first silicon nitride layer on said gate electrode and on said glass substrate;

forming a silicon layer on said first silicon nitride layer;

forming a second silicon nitride layer on said silicon layer;

forming a first positive photoresist on said second silicon nitride layer;

exposing said first positive photoresist from a back side of said glass substrate using said gate electrode as a mask and removing exposed portion of said first positive photoresist;

etching said second silicon nitride layer using said first positive photoresist as a mask, thereby leaving residual portion of said second silicon nitride layer over said gate electrode;

removing said first positive photoresist;

forming a doped silicon layer along a surface of said silicon layer and said residual portion of said second silicon nitride layer;

forming a negative photoresist on said doped silicon layer;

exposing said negative photoresist from said back side of said glass substrate using said gate electrode as a mask and then removing unexposed portion of said negative photoresist;

etching said doped silicon layer using said negative photoresist as a mask, thereby exposing said residual portion of said second silicon nitride layer;

removing said negative photoresist;

patterning a second positive photoresist on said doped silicon layer to define a contact region;

etching said residual portion of said second silicon nitride layer, said silicon layer and said first silicon nitride layer to from a contact hole;

forming a second metal layer on said doped silicon layer, said residual portion of said second silicon nitride layer and in said contact hole;

forming a third metal layer on said second metal layer;

performing a thermal process to form silicide at the interface between said doped silicon layer and said second metal layer;

patterning a third positive photoresist on said third metal layer;

etching said third metal layer using said third positive photoresist as a mask;

removing said third positive photoresist;

etching said second metal layer using said etched third metal layer as a mask, thereby forming source and drain regions;

etching said silicon layer and doped silicon layer to define an island pattern; and forming a passivation layer over said glass substrate.

2. The method of claim 1, wherein said first metal layer is selected from a group consisting of chromium (Cr), tungsten (W), titanium (Ti), tantalum (Ta) and molybdenum (Mo).

3. The method of claim 1, wherein said silicon layer comprises amorphous silicon layer.

4. The method of claim 1, wherein said doped silicon layer comprises silicon layer having n conductive type dopant.

5. The method of claim 4, wherein said n conductive type dopant comprises phosphorus.

6. The method of claim 4, wherein said n conductive type dopant comprises arsenic.

7. The method of claim 1, wherein said second silicon nitride layer is etched using said first positive photoresist as a mask by buffer hydrofluoric acid.

8. The method of claim 1, wherein said second silicon nitride layer is etched using said first positive photoresist as a mask by dry etching containing $SF_6$, $O_2$.

9. The method of claim 1, wherein said second metal layer comprises Cr.

10. The method of claim 1, wherein said second metal layer comprises Mo.

11. The method of claim 1, wherein said third metal layer comprises Al.

12. The method of claim 1, wherein said third metal layer comprises Al—Nd.

13. The method of claim 1, wherein said thermal process is performed in ambient containing air.

14. The method of claim 1, wherein said thermal process is performed in ambient containing $N_2$.

15. The method of claim 1, wherein said thermal process is performed at a temperature about 200 to 300 degrees centigrade.

16. The method of claim 1, wherein said thermal process is performed about 30–90 minutes.

* * * * *